US011748652B1

(12) United States Patent
Kubica et al.

(10) Patent No.: US 11,748,652 B1
(45) Date of Patent: Sep. 5, 2023

(54) HERALDING OF AMPLITUDE DAMPING DECAY NOISE FOR QUANTUM ERROR CORRECTION

(71) Applicant: Amazon Technologies, Inc., Seattle, WA (US)

(72) Inventors: Aleksander Marek Kubica, Los Angeles, CA (US); Alex Retzker, Pasadena, CA (US)

(73) Assignee: Amazon Technologies, Inc., Seattle, WA (US)

(*) Notice: Subject to any disclaimer, the term of this patent is extended or adjusted under 35 U.S.C. 154(b) by 66 days.

(21) Appl. No.: 17/548,383

(22) Filed: Dec. 10, 2021

(51) Int. Cl.
*H03M 13/00* (2006.01)
*G06N 10/70* (2022.01)
*H03M 13/11* (2006.01)

(52) U.S. Cl.
CPC ......... *G06N 10/70* (2022.01); *H03M 13/1111* (2013.01)

(58) Field of Classification Search
CPC .................. G06N 10/70; H03M 13/1111
See application file for complete search history.

(56) References Cited

U.S. PATENT DOCUMENTS

| | | | |
|---|---|---|---|
| 2019/0044543 A1* | 2/2019 | Chamberland | G06N 10/00 |
| 2020/0242500 A1* | 7/2020 | Girvin | G06F 11/322 |
| 2020/0274554 A1* | 8/2020 | Aspuru-Guzik | G06N 10/00 |
| 2020/0334104 A1* | 10/2020 | Rosenblum | G06F 11/1004 |
| 2021/0232963 A1* | 7/2021 | Gimeno-Segovia | G06N 10/70 |
| 2022/0222567 A1* | 7/2022 | Reagor | G01B 9/0203 |

OTHER PUBLICATIONS

Andrew S. Darmawan, et a., "Tensor-Network Simulations of the Surface Code under Realistic Noise," arXiv preprint: arXiv:1607.064602, pp. 1-8, 2017.
P. Krantz, et al., "A Quantum Engineer's Guide to Superconducting Qubits," arXiv preprint: arXiv:1904.06560v5, pp. 1-67, 2021.

(Continued)

*Primary Examiner* — Kyle Vallecillo
*Assistant Examiner* — Enamul M Kabir
(74) *Attorney, Agent, or Firm* — Alexander A. Knapp; Kowert, Hood, Munyon, Rankin & Goetzel, P.C.

(57) ABSTRACT

A system and method for indicating, via a heralding signal, that an amplitude damping decay event has occurred within a quantum low-density parity-check (LDPC) code is disclosed. Logical information may be encoded into a superconducting qubit using one or more transmons, wherein a first level and a second level are encoded into a code space of the qubit, and at least one intermediate level outside of the code space characterizes an amplitude damping decay channel which is then used to herald an amplitude damping decay event. Dynamical decoupling pulse sequences may be used to drive such qubit structures and bias noise towards the amplitude damping decay channel. The one or more heralding signals within a lower-level code may then be used as input to a quantum LDPC code for decoding syndrome measurements with the knowledge of occurrences of amplitude damping decay as indicated via the one or more heralding signals.

20 Claims, 11 Drawing Sheets

(56) References Cited

OTHER PUBLICATIONS

Eliot Kapit, "Error-transparent quantum gates for small logical qubit architectures," Department of Physics and Engineering Physics, arXiv preprint: arXiv:1703.09762v1, pp. 1-8 2017.

S. Rosenblum, P. Reinhold, M. Mirrahimi, L. Jiang, L. Frunzio, and R. J. Schoelkopf, "Fault-tolerant detection of a quantum error," Science vol. 361, Issue 6399, pp. 266-270, 2018.

E. A. Sete, A. Galiautdinov, E. Mlinar, J. M. Martinis, and A. N. Korotkov, "Catch-Disperse-Release Readout for Superconducting Qubits," Physical review letters 110, 210501 pp. 1-5, (2013).

R. Duan, M. Grassl, Z. Ji, and B. Zeng, "Multi-error-correcting amplitude damping codes", in 2010 IEEE International Symposium on Information Theory (IEEE, 2010) pp. 2672-2676.

M. Grassl, L. Kong, Z. Wei, Z.-Q. Yin, and B. Zeng, "Quantum Error-Correcting Codes for Qudit Amplitude Damping," IEEE Transactions on Information Theory 64, 4674, arXiv:1509.6829 [quant-ph], pp. 1-22, 2015.

A. Kitaev, "Fault-tolerant quantum computation by anyons," Annals of Physics vol. 303, Issue 1, Jan. 2003, pp. 2-30.

S. B. Bravyi and A. Y. Kitaev, "Quantum codes on a lattice with boundary," arXiv preprint quant-ph/9811052, pp. 1-6 (1998).

E. Dennis, A. Kitaev, A. Landahl, and J. Preskill, "Topological quantum memory," Journal of Mathematical Physics 43, 4452 (2002), arXiv preprint: arXiv:quant ph/0110143, pp. 1-39 on 2001.

N. Delfosse and N. H. Nickerson, "Almost-linear time decoding algorithm for topological codesk," arXiv preprint arXiv:1709.06218v3, pp. 1-12 (2021).

A. S. Darmawan and D. Poulin, "Tensor-Network Simulations of the Surface Code under Realistic Noise," Physical review letters 119, 040502 (2017), arXiv preprint: arXiv:1607.06460 [quant-ph], pp. 1-5.

E. Kapit, "Error-Transparent Quantum Gates for Small Logical Qubit Architectures," Physical review letters 120, 050503 (2018), arXiv preprint: arXiv:1703.09762 [quant-ph], pp. 1-8 in 2017.

* cited by examiner

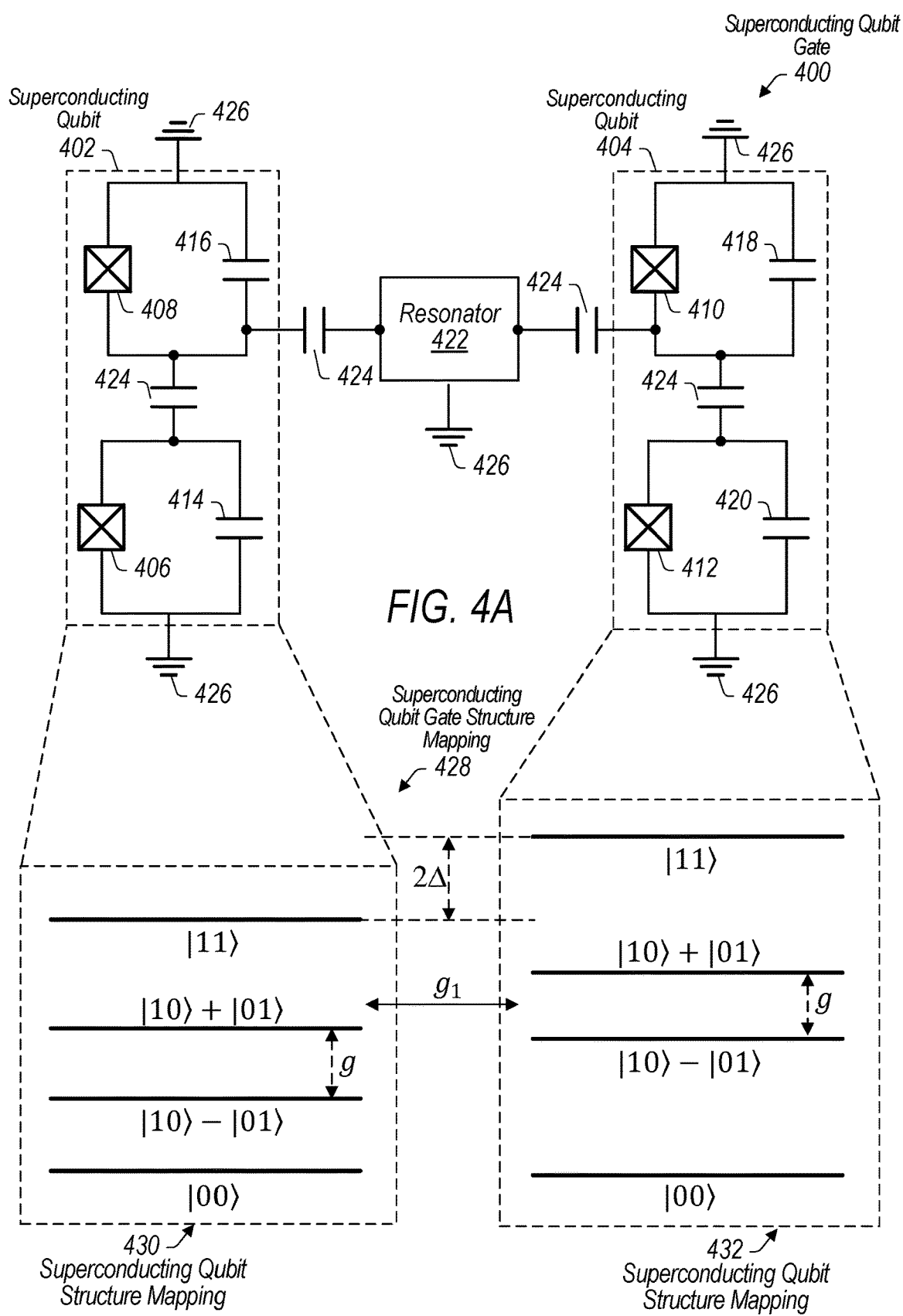

HERALDING OF AMPLITUDE DAMPING DECAY NOISE FOR QUANTUM ERROR CORRECTION

BACKGROUND

Quantum computing utilizes the laws of quantum physics to process information. Quantum physics is a theory that describes the behavior of reality at the fundamental level. It is currently the only physical theory that is capable of consistently predicting the behavior of microscopic quantum objects (e.g., particles) like photons, molecules, atoms, and electrons.

A quantum computing device is a device that utilizes quantum mechanics to allow one to write, store, process and read out information encoded in quantum states, e.g., the states of quantum objects. A quantum object is a physical object that behaves according to the laws of quantum physics. The state of a physical object is a description of the object at a given time.

In quantum mechanics, the state of a two-level quantum system, or simply, a qubit, is a list of two complex numbers, where the absolute sum of the complex numbers must sum to one. Each of the two numbers is called an amplitude, or quasi-probability. The square of an amplitude gives a potentially negative probability. Hence, each of the two numbers correspond to the square root that event zero and event one will happen, respectively. A fundamental and counterintuitive difference between a probabilistic bit (e.g., a traditional zero or one bit) and the qubit is that a probabilistic bit represents a lack of information about a two-level classical system, while a qubit contains maximal information about a two-level quantum system.

Quantum computing devices are based on such quantum bits (qubits), which may experience the phenomena of "superposition" and "entanglement." Superposition allows a quantum system to be in multiple states at the same time. For example, whereas a classical computer is based on bits that are either zero or one, a qubit may be both zero and one at the same time, with different probabilities assigned to zero and one. Entanglement is a strong correlation between quantum particles, such that the quantum particles are inextricably linked in unison even if separated by great distances.

There are different types of qubits that may be used in quantum computers, each having different advantages and disadvantages. For example, some quantum computers may include qubits built from superconductors, trapped ions, semiconductors, photonics, etc. Each may experience different levels of interference, errors and decoherence. Also, some may be more useful for generating particular types of quantum circuits or quantum algorithms, while others may be more useful for generating other types of quantum circuits or quantum algorithms.

BRIEF DESCRIPTION OF THE DRAWINGS

FIG. 4A illustrates another superconducting qubit gate configured to herald an event of amplitude damping decay, according to some embodiments.

FIG. 4B illustrates a superconducting qubit gate structure mapping, such as for a superconducting qubit gate shown in FIG. 4A, wherein the mapping is configured to herald an event of amplitude damping decay, according to some embodiments.

Figure 1:
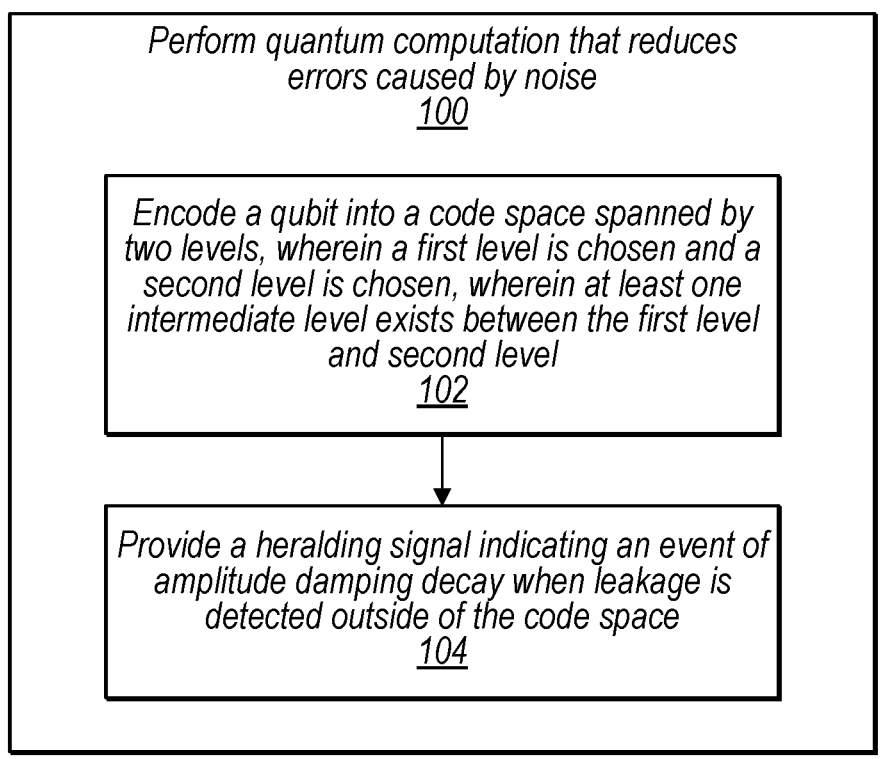
FIG. 1 is a flowchart illustrating a process of performing quantum computation that reduces errors caused by noise via the use of a heralding signal to signal amplitude damping decay events, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to methods and systems for performing quantum computation that reduce errors caused by noise. For example, the use of one, two, or more transmons for encoding a qubit into a code space allows for a more flexible mapping system, wherein stochastic noise may be biased into one or more decay channels for interpretation during decoding syndrome measurements.

In some situations, noise models which utilize the depolarizing channel error correction method result in a complex error correction code. In an effort to simplify such procedure biased noise models, the embodiments discussed herein reduce the resources needed to scale quantum computers by biasing the noise such that an amplitude damping decay event may be heralded.

In some embodiments, dynamical decoupling pulse sequences are used to bias the weak stochastic noise towards a channel that describes the amplitude damping decay process. In some embodiments, such as in a superconducting architecture, most forms of noise besides amplitude damping decay noise can be reduced by using dynamical decoupling pulse sequences, therefore amplifying the relative part of the amplitude damping decay noise. In some embodiments, the dynamical decoupling pulse sequences act as a drive for one or more qubits.

In some embodiments, the ground state and second excited states of a transmon are used to map the code space of the qubit configured to signal an event of amplitude damping decay. The first excited state of the transmon can therefore be used as a buffer state, also sometimes referred to as an intermediate state or virtual state. As it is outside of the mapped code space, the first excited state can be used to indicate, via a heralding signal, that an amplitude damping decay event has occurred.

Some embodiments may parametrically drive the qubit at the frequency of the transition from the second excited state to the ground state of the transmon, and indicate, via a heralding signal, that an amplitude damping decay event has occurred.

Some embodiments may utilize two resonant transmons that, when coupled together, form a gate in order to signal that an amplitude damping decay event has taken place. In one particular configuration of this embodiment, two coupled transmons with a given capacitive coupling coefficient are used to map the code space of the qubit configured to signal the event of an amplitude damping decay. Other embodiments may include Stark shift based gates, cross resonance based gates, or adiabatic hybridized gates in order to realize this architecture. Furthermore, some embodiments may utilize more than two transmons to map a code space in order to signal that an amplitude damping decay event has occurred. In these embodiments, a first level and a second level are chosen from n available levels within m transmons, as defined by the number of transmons utilized. One or more levels that are outside of said code space may be used to signal that an amplitude damping decay event has occurred. Such heralding of the event of amplitude damping decay is encoded into an amplitude damping channel described at a lower-level code, wherein said encoding may be made using quantum dual-rail code, single-qutrit code, double-qutrit code, or other encoding technique embodiments which produce a measurable confirmation that an amplitude damping decay event has occurred. This measurable result is then used as an input to a quantum low-density parity-check code wherein the decoding syndrome measurements take place.

FIG. 1 is a flowchart illustrating a process of performing quantum computation that reduces errors caused by noise via encoding logical information in qubits, according to some embodiments.

At block 100 a quantum computing device performs quantum computation that reduces errors caused by noise as compared to previous systems that did not provide a heralding of events of amplitude damping decay. In some embodiments, this comprises at least two steps, e.g., block 102 and block 104. In block 102, a qubit is encoded into a code space, wherein the code space comprises a first level, or energy state, that is chosen and a second level, or energy state, that is chosen, such that there is at least one intermediate level between the first and second levels. In some embodiments, one of the at least one intermediate levels outside of the code space may be used to herald an event indicating amplitude damping decay, such as in block 104, wherein the heralding signal is triggered by leakage detected outside the code space.

Figure 2A:
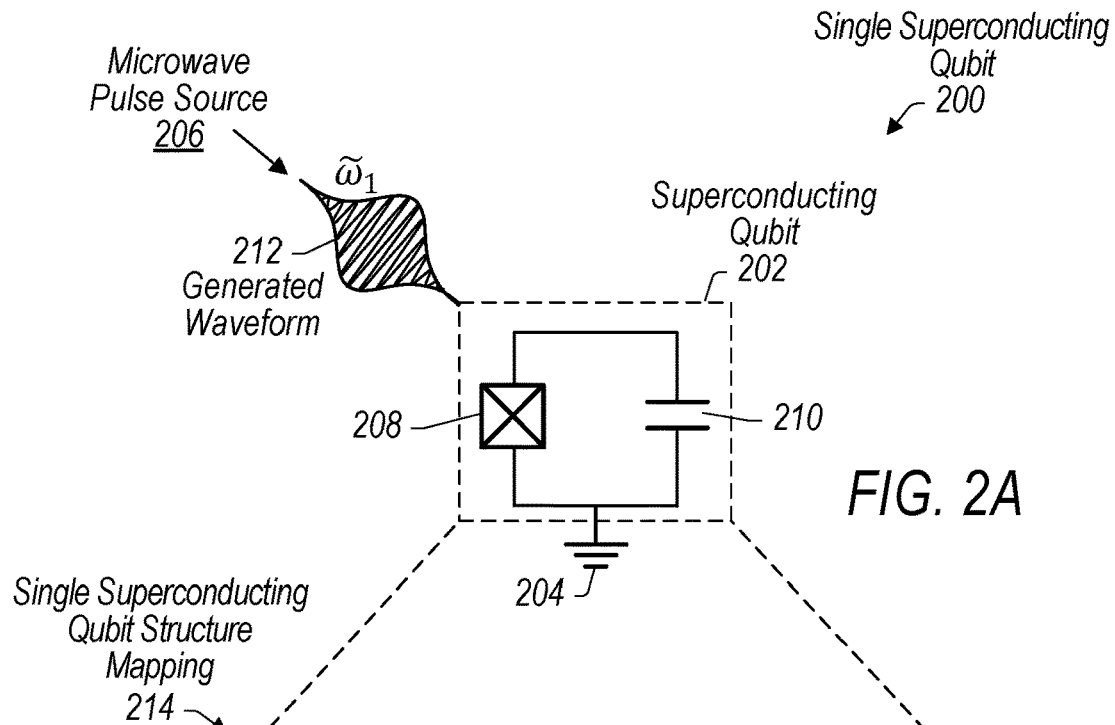
FIG. 2A illustrates a single superconducting qubit configured to herald an event of amplitude damping decay, according to some embodiments.

FIG. 2A illustrates a single superconducting qubit configured to herald an event of amplitude damping decay, according to some embodiments.

In some embodiments, single superconducting qubit 200 comprises superconducting qubit 202, which is connected to ground 204 and is driven by microwave pulse source 206. In some embodiments, superconducting qubit 202 is characterized by a Josephson circuit comprising Josephson sub-circuit 208 shunted by capacitance Cs 210. The embodiment shown in FIG. 2A of superconducting qubit 202 describes a transmon, however other configurations which comprise a superconducting qubit circuit may be applied, in some embodiments.

In some embodiments, microwave pulse source 206 produces a generated waveform 212 with given frequency $\tilde{\omega_1}$ used to drive superconducting qubit 202. In some embodiments, microwave pulse source 206 may comprise a microwave drive line, a pulsed laser source, or an arbitrary waveform generator. When some of the aforementioned sources are combined, they may generate a waveform 212, also referred to as a wave packet or pulse sequence, with a frequency resonant to superconducting qubit 202, such as $\tilde{\omega_1}$. In the embodiment shown in FIG. 2A, the frequency of generated waveform 212 is resonant with that of superconducting qubit 202, such that generated waveform 212 is configured as a dynamical decoupling pulse sequence configured to bias noise, as described above.

Figure 2B:
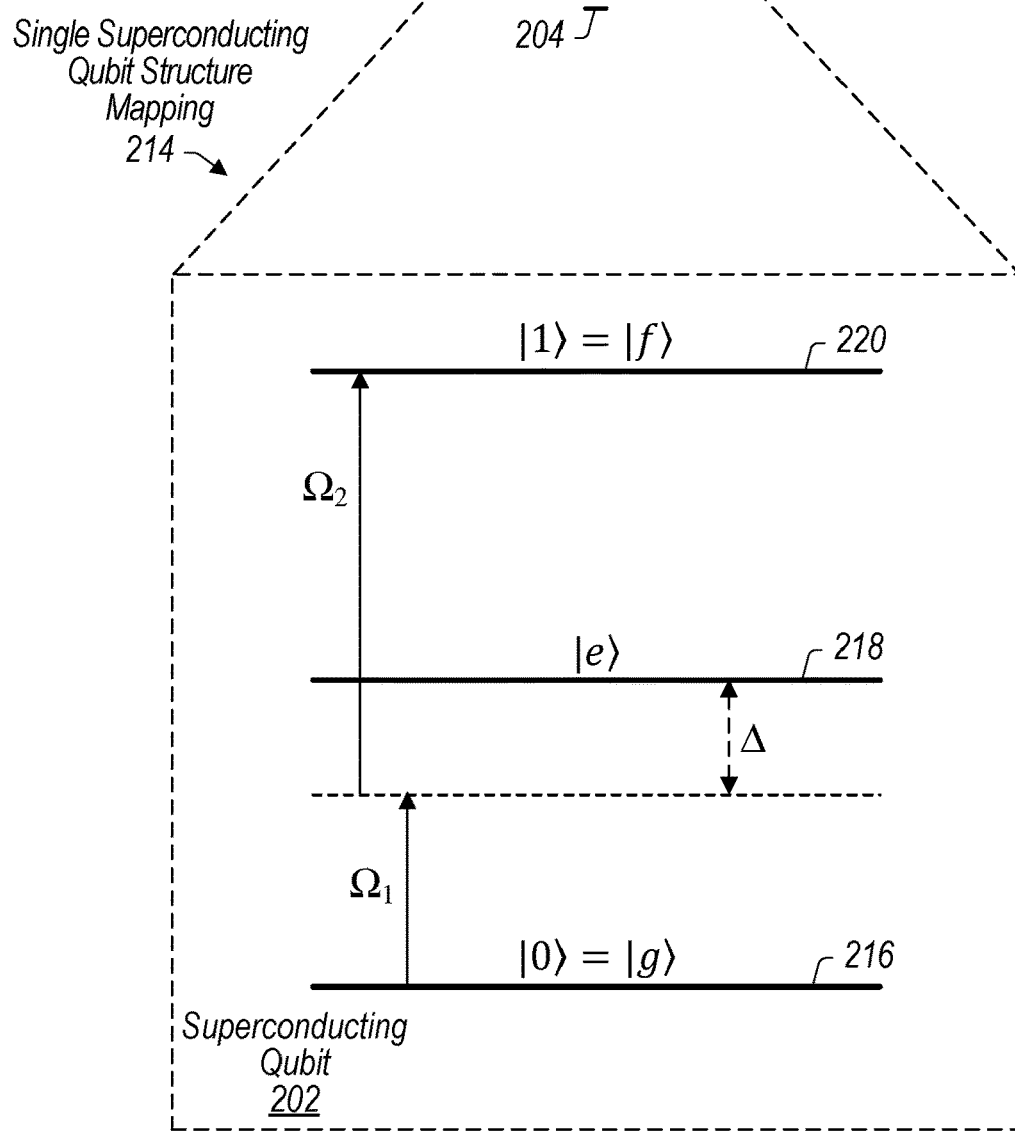
FIG. 2B illustrates a single superconducting qubit structure mapping, such as for a single superconducting qubit shown in FIG. 2A, wherein the mapping is configured to herald an event of amplitude damping decay, according to some embodiments.

FIG. 2B illustrates a single superconducting qubit structure mapping, such as for a single superconducting qubit shown in FIG. 2A, wherein the mapping is configured to herald an event of amplitude damping decay, according to some embodiments.

In some embodiments, single superconducting qubit 200 may be mapped according to single superconducting qubit structure mapping 214. In the embodiment shown in FIG. 2B, a ground state 216, $|g\rangle$, of superconducting qubit 202 is mapped to a first level of the encoded qubit code space, or $|0\rangle$. Additionally, a second excited state 220, $|f\rangle$, of superconducting qubit 202 is mapped to a second level of the encoded qubit code space, or $|1\rangle$. Furthermore, a first excited state 218 of superconducting qubit 202 is referred to as intermediate level $|e\rangle$, and it is outside of the code space.

In the embodiment shown in FIG. 2B, ground state 216 and second excited state 220 are driven via the intermediate level $|e\rangle$, with an effective coupling of $$\Omega_{eff} = \frac{\Omega_1 \Omega_2}{\Delta}$$

and dressed states $$|\pm\rangle = \frac{1}{\sqrt{2}}(|0\rangle \pm |1\rangle).$$

In other embodiments, more than one intermediate level may exist between a higher excited state 220 and a lower excited state 216. Furthermore, intermediate level $|e\rangle$ can also be referred to as a buffer state or virtual state/level.

In some embodiments, intermediate level $|e\rangle$ may be used to trigger a heralding signal. For example, measurements that indicate superconducting qubit 200 is outside the code space may be interpreted as a heralding signal indicating that an amplitude damping decay event has occurred. As discussed herein, this information may be used to account for such an event of amplitude damping decay, such as by using the heralding signal as input to a quantum low-density parity-check code, erasing the superconducting qubit 200 that is known to have experienced an event of amplitude damping decay, or by accounting for the known error in other ways.

Figure 3A:
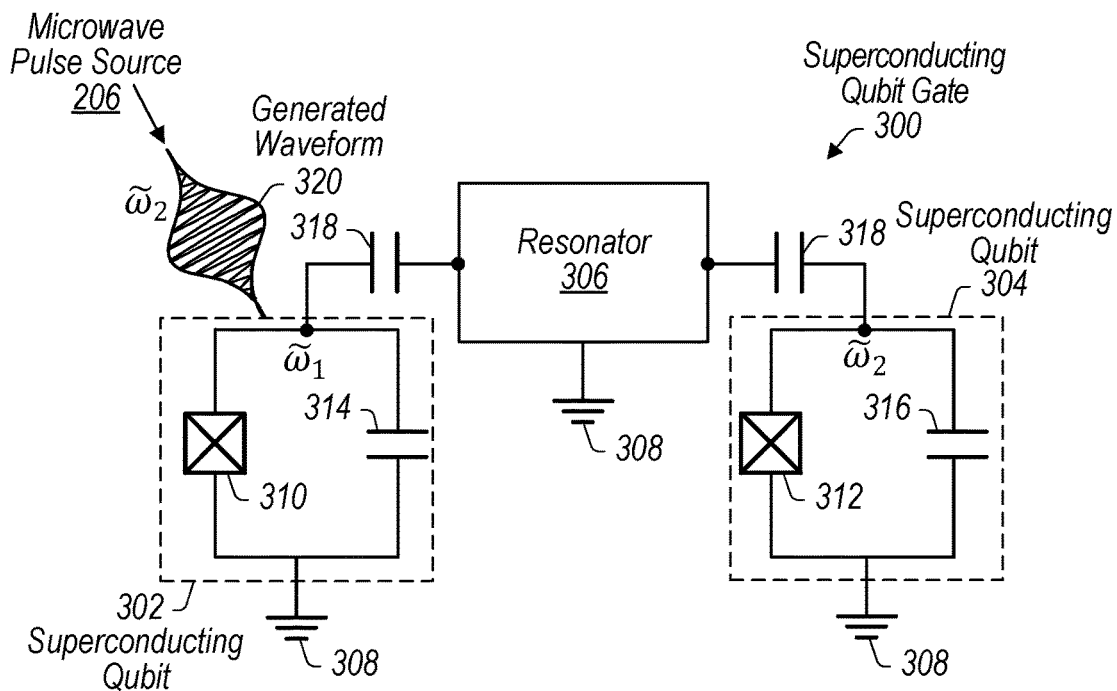
FIG. 3A illustrates a superconducting qubit gate configured to herald an event of amplitude damping decay, according to some embodiments.

FIG. 3A illustrates a superconducting qubit gate configured to herald an event of amplitude damping decay, according to some embodiments.

In some embodiments, superconducting qubit gate 300 comprises superconducting qubit 302 and superconducting qubit 304, wherein superconducting qubits 302 and 304 are capacitively connected via capacitances 318 and resonator 306, and all aforementioned components are connected to ground 308. In some embodiments, resonator 306, also referred to as a coupler, may have a capacitive coupling coefficient of g. In the embodiment shown in FIG. 3A, superconducting qubit gate 300 is driven by microwave pulse source 206, wherein microwave pulse source 206 produces generated waveform 320 with given frequency $\widetilde{\omega_2}$. In the embodiment shown in FIG. 3A, generated waveform 320 has a frequency resonant with superconducting qubit 304, such that superconducting qubit 302 is driven by superconducting qubit 304 via resonator 306.

In some embodiments, superconducting qubits 302 and 304 are characterized by Josephson circuits comprising Josephson subcircuits 310 and 312, respectively, wherein Josephson subcircuits are each shunted by capacitance 314 and 316, respectively. The embodiment shown in FIG. 3A of superconducting qubits 302 and 304 describe transmons, however other embodiments which comprise superconducting qubit circuits may be applied.

Figure 3B:
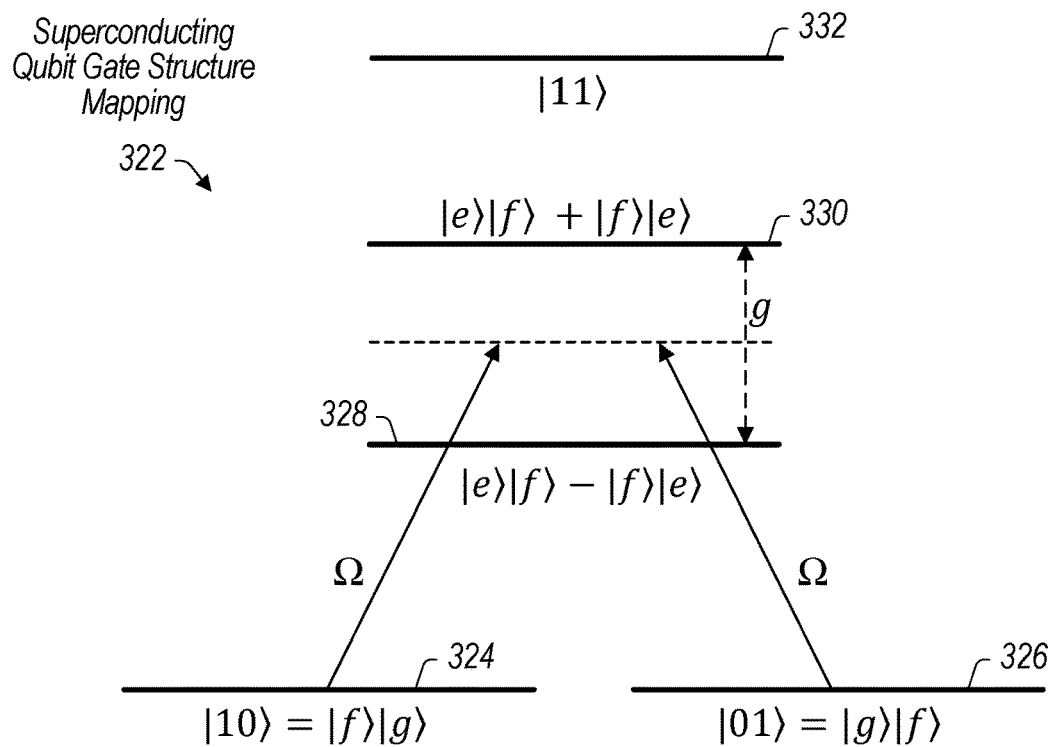
FIG. 3B illustrates a superconducting qubit gate structure mapping, such as for a superconducting qubit gate shown in FIG. 3A, wherein the mapping is configured to herald an event of amplitude damping decay, according to some embodiments.

FIG. 3B illustrates a superconducting qubit gate structure mapping, such as for a superconducting qubit gate shown in FIG. 3A, wherein the mapping is configured to herald an event of amplitude damping decay, according to some embodiments.

In some embodiments, superconducting qubit gate 300 may be mapped according to superconducting qubit gate structure mapping 322. In the embodiment shown in FIG. 3B, the mapping is dependent upon the capacitive coupling coefficient g of resonator 306 shown in FIG. 3A. In this manner, superconducting qubit 304 is driven by superconducting qubit 302 via generated waveform 320 with frequency $\widetilde{\omega_2}$, resulting in an effective coupling of $$\Omega_{eff} = \frac{\Omega^2}{g}$$

and dressed states $|\widetilde{01}\rangle$ and $|\widetilde{10}\rangle$..

In the embodiment shown in FIG. 3B, either ground state 324 or 326 of superconducting qubits 302 and 304, respectively, is mapped to a first level of the code space, or $|00\rangle$.. Excited state 332 is then mapped to a second level of the code space, or $|11\rangle$.. According to the capacitive coupling coefficient g of resonator 306, dressed state $|\widetilde{10}\rangle$ is represented by state 328 and dressed state $|\widetilde{01}\rangle$ is represented by state 330, wherein states 328 and 330 are outside of the code space. In other embodiments, other combinations of excited dressed states may exist between states 332, 324, and 326 which may also produce dressed states $|\widetilde{01}\rangle$ and $|\widetilde{10}\rangle$..

In some embodiments, dressed states $|\widetilde{01}\rangle$ and $|\widetilde{10}\rangle$ may be used to trigger a heralding signal. For example, measurements that indicate that the superconducting qubit gate 300 is outside of the code space may be interpreted as a heralding signal indicating that an amplitude damping decay event has occurred. As discussed herein, this information may be used to account for such an event of amplitude damping decay, such as by using the heralding signal as input to a quantum low-density parity-check code, erasing the superconducting qubits 302 or 304 that are known to have experienced an event of amplitude damping decay, or by accounting for the known error in other ways.

FIG. 4A illustrates another superconducting qubit gate configured to herald an event of amplitude damping decay, according to some embodiments.

In some embodiments, superconducting qubit gate 400 comprises superconducting qubit 402 and superconducting qubit 404 with capacitive coupling coefficients of g, wherein superconducting qubits 402 and 404 are capacitively connected via capacitances 424 to resonator 422, and all aforementioned components are connected to ground 426. In some embodiments, resonator 422 may have a capacitive coupling coefficient of gi. In the embodiment shown in FIG. 4A, superconducting qubit gate 400 is driven by a microwave pulse source such as microwave pulse source 206 described in FIGS. 2A and 3A.

In some embodiments, superconducting qubits 402 and 404 are characterized by Josephson circuits comprising Josephson subcircuits 406, 408, 410 and 412, wherein Josephson subcircuits 406, 408, 410 and 412 are each shunted by capacitance 414, 416, 418, and 420, respectively. In the embodiment shown in FIG. 4A, superconducting qubits 402 and 404 are each described with two transmons, however other embodiments which comprise superconducting qubit circuits may be applied.

FIG. 4B illustrates a superconducting qubit gate structure mapping, such as for a superconducting qubit gate shown in FIG. 4A, wherein the mapping is configured to herald an event of amplitude damping decay, according to some embodiments.

In some embodiments, superconducting qubit gate 400 may be mapped according to superconducting qubit gate structure mapping 428, also known as mapping two capacitively coupled dual-rail qubits. In the embodiment shown in FIG. 4B, the mapping is dependent upon the capacitive coupling coefficient gi of resonator 422 shown in FIG. 4A and a height detuning of Δ which results in a dispersive coupling of $$\frac{g_1^2}{\Delta^2}\alpha.$$

In some embodiments, superconducting qubit gate structure mapping 428 is comprised of two sets of two transmons, resulting in superconducting qubit structure mappings 430 and 432, as shown in FIG. 3B, which are then capacitively coupled via resonator 422.

Some embodiments, such as the aforementioned embodiments shown in FIGS. 2A-4B, encode a code space of a qubit using one, two, or four transmons. However, embodiments comprising other combinations of one or more transmons used to encode a code space of a qubit may applied, wherein one or more levels outside of the code space in these embodiments may be used to signal an event of amplitude damping decay.

Figure 5:
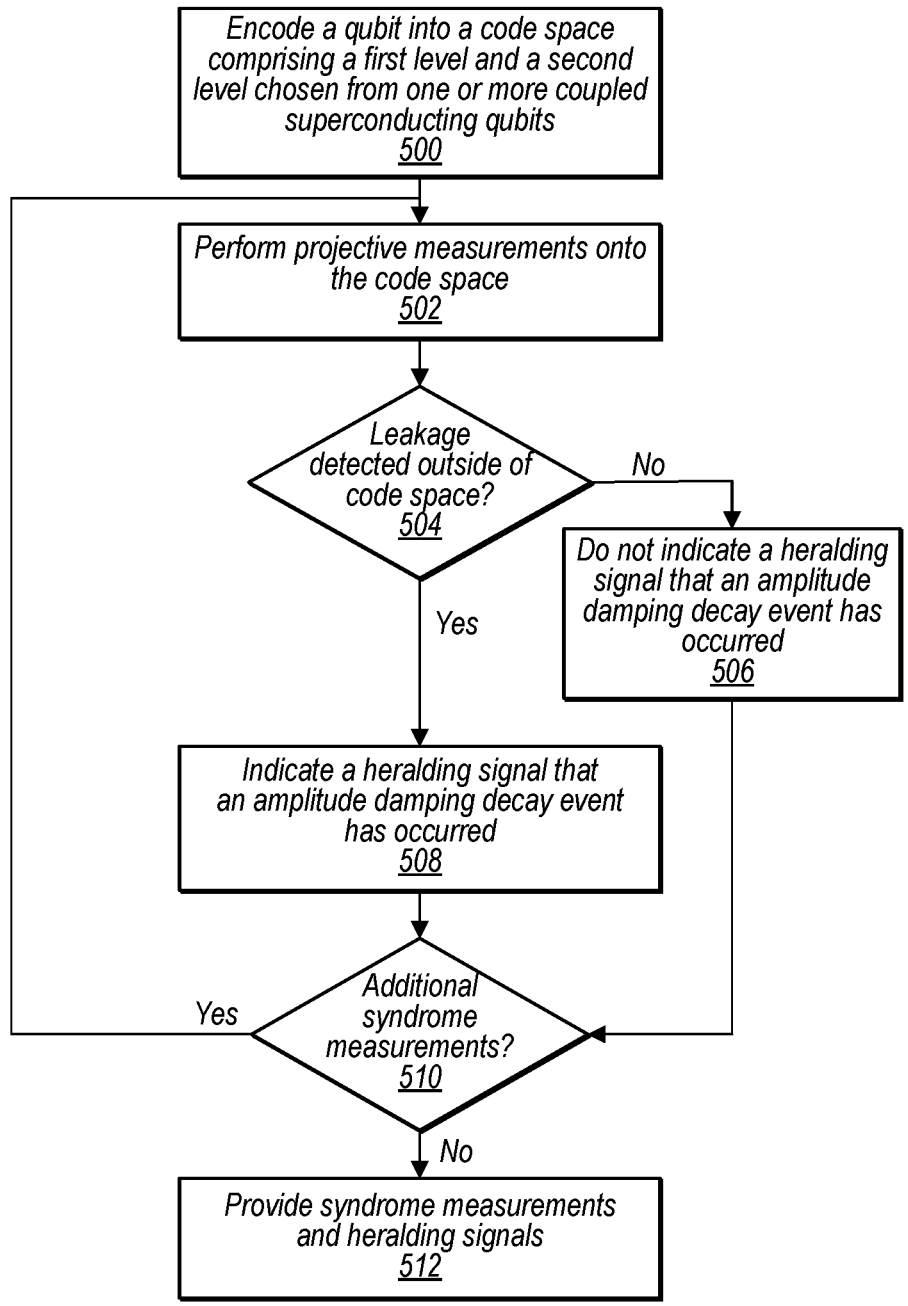
FIG. 5 is a flowchart illustrating a process of encoding a qubit into a code space wherein the encoding is configured to herald that an amplitude damping decay event has occurred, according to some embodiments.

FIG. 5 is a flowchart illustrating a process of encoding a qubit into a code space, wherein the encoding is configured to herald that an amplitude damping decay event has occurred, according to some embodiments.

In block 500, one or more transmons are used to encode a qubit into a code space, such as in the embodiments shown in FIGS. 2A-4B, wherein the code space comprises a first level and a second level selected from the available levels of the one or more transmons according to the configuration used, according to some embodiments. The one or more available levels not already mapped to the code space may be used to signal an amplitude damping decay event, according to some embodiments. In block 502, projective measurements are then performed onto the code space that has been mapped according to block 500. Proceeding to block 504, it is determined based on the projective measurements of block 502 whether there is leakage detected outside of the code space. If so, a heralding signal is indicated at block 508 that an amplitude damping decay event has occurred. Furthermore, if the projective measurements of block 502 confirm that no leakage is detected outside of the code space, no heralding signal is indicated, according to block 506. The process of blocks 502-510 may be repeated for one or more rounds of syndrome measurements, as shown in block 510. After the final round of syndrome measurements has been completed, the syndrome measurements and heralding signals, if indeed leakage was detected outside of the code space during the one or more rounds of syndrome measurements, are then provided according to block 512.

In some embodiments, the heralding signal(s) may indicate an amplitude damping decay event without collapsing the photon out of a superposition state. Additionally, the heralding signal may not reveal additional information about the photon other than the fact that it has decayed to a lower energy state.

In some embodiments, the projective measurements described above may be conducted using a dispersive syndrome measurement. In other embodiments, the projective measurements may be conducted using x matching techniques or catch-disperse-release methods. Further embodiments may comprise the use of an ancilla qubit in which the one of the one or more intermediate states outside of the code space is mapped to the ancilla qubit and driven in this manner. In some embodiments, the heralding signal may be indicated via a state of the ancilla qubit.

Figure 6A:
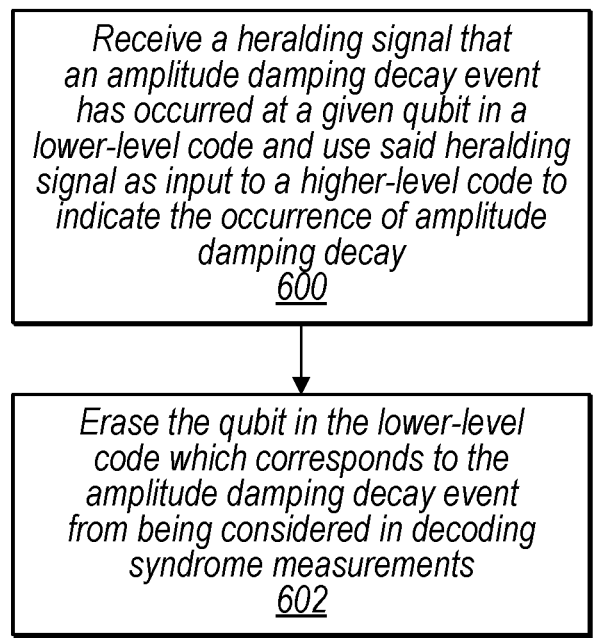
FIG. 6A is a flowchart illustrating a process of receiving a heralding signal, at a quantum low-density parity-check code, that an amplitude damping decay event has occurred within a lower-level code, and conducting an erasure of a corresponding qubit, according to some embodiments.

FIG. 6A is a flowchart illustrating a process of receiving a heralding signal, at a quantum low-density parity-check code, that an amplitude damping decay event has occurred within a lower-level code, and conducting an erasure of a corresponding qubit, according to some embodiments.

In some embodiments, heralding signals that one or more amplitude damping decay events have occurred are indicated within a lower-level code, such as in block 508 of FIG. 5. In block 600, these heralding signals are then provided, such as in block 512 of FIG. 5, as inputs to a quantum low-density parity-check code. In some embodiments, at block 602, respective heralding signal inputs are then configured such that the corresponding qubit in the lower-level code is erased from being considered in decoding syndrome measurements in the quantum low-density parity-check code.

In some embodiments, block 602 may refer to an erasure event in which quantum computation received from the corresponding qubit in the lower-level code is not considered in decoding syndrome measurements in a matching graph for a quantum low-density parity-check code. For example, in a minimum weight perfect matching (MWPM) graph, data edges for qubits that are associated with a heralding event may be erased, or weighted differently with the knowledge that they are likely to have been affected by amplitude damping decay, as indicated by the heralding signal. However, in some embodiments, block 602 may refer to an erasure event in which quantum computation received from the corresponding qubit in the lower-level code is given less weight in decoding syndrome measurements, and quantum computation received from redundant qubits are given proportionally larger weight in decoding syndrome measurements.

In some embodiments, the one or more heralding signals in the lower-level code are described by an amplitude damping channel, $\mathcal{A}$, , such that the amplitude damping channel serves as an input to the quantum low-density parity-check code. In some embodiments, $\mathcal{A}$ is defined as a quantum channel from a generalized form of a quantum channel, $\mathcal{K}$, , and its Kraus operators $\{K_i\}_i$, such that an action of $\mathcal{K}$ on a density matrix ρ is:

$$\mathcal{K}(\rho)=\Sigma_i K_i \rho K_i^\dagger.$$

In some embodiments of a two-level system, $\mathcal{A}$ is defined as the following:

$$\mathcal{A}_2\{|0\rangle\langle 0|+\sqrt{1-\gamma}|1\rangle\langle 1|, \sqrt{\gamma}|0\rangle\langle 0|\}.$$

In some embodiments of a three-level system, $\mathcal{A}$ is defined as the following, wherein $\gamma_{01}$, $\gamma_{12}$, and $\gamma_{02}$ describe the probabilities of an amplitude damping decay event occurring between levels 0 and 1, 1 and 2, or 0 and 2, respectively:

$$\mathcal{A}_3=\{|0\rangle\langle 0|+\sqrt{1-\gamma_{01}}|1\rangle\langle 1|+\sqrt{1-\gamma_{02}-\gamma_{12}}|2\rangle\langle 2|, \sqrt{\gamma_{01}}|0\rangle\langle 1|, \sqrt{\gamma_{02}}|0\rangle\langle 2|, \sqrt{\gamma_{12}}|1\rangle\langle 2|\}.$$

Furthermore, in some embodiments, the probability of decaying between levels 0 and 1 or 1 and 2 are equal, such that the symmetrized amplitude damping channel, $\mathcal{A}_3'$, is defined as:

$$\mathcal{A}_3'=\{\sqrt{1-\gamma}|0\rangle\langle 0|+\sqrt{1-2\gamma}|1\rangle\langle 1|+\sqrt{1-\gamma}|2\rangle\langle 2|, \sqrt{\gamma}|0\rangle\langle 1|, \sqrt{\gamma}|1\rangle\langle 2|, \sqrt{\gamma}|0\rangle\langle 2|\}.$$

Figure 6B:
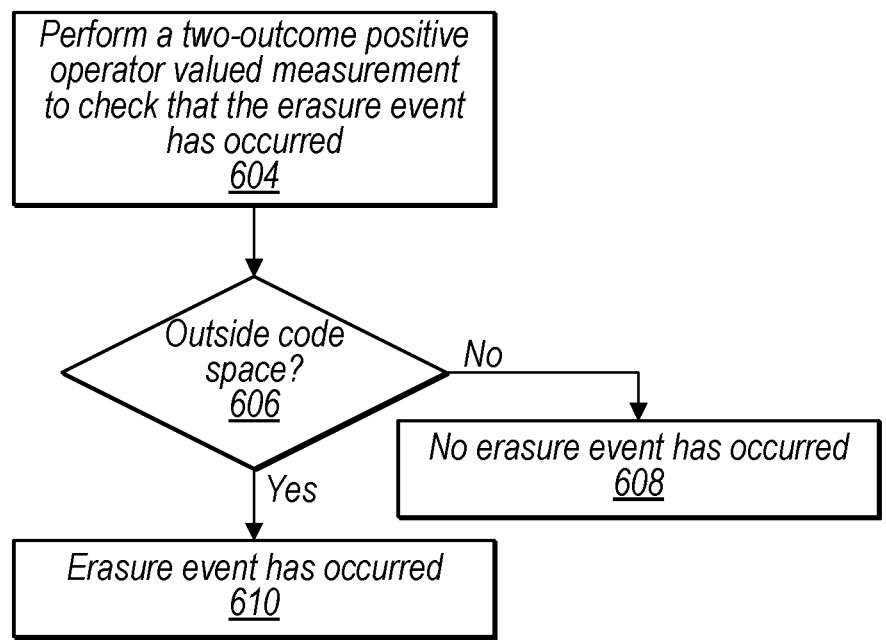
FIG. 6B is a flowchart illustrating a process of checking that the erasure event according to the embodiment in FIG. 6A has occurred, according to some embodiments.

FIG. 6B is a flowchart illustrating a process of checking that the erasure event according to the embodiment in FIG. 6A has occurred, according to some embodiments.

In some embodiments, an erasure event, such as in block 602 of FIG. 6A, is diagnosed by performing a two-outcome positive operator valued measurement in block 604. An erasure event is confirmed to have occurred in block 610 when the outcome of the two-outcome positive operator valued measurement is 1, according to the comparison of block 606. An erasure event is confirmed to not have occurred in block 608 when the outcome of the two-outcome positive operator valued measurement is 0, according to the comparison of block 606.

In some embodiments, such as the embodiment shown in FIG. 2B, a two-outcome positive operator valued measurement may be performed onto a qubit that has been encoded into a single three-level system, which may be referred to as single-qutrit code. The mapping, such as single superconducting qubit structure mapping 214 shown in FIG. 2B, comprises:

$\varepsilon_L: |0\rangle \mapsto |0\rangle, |1\rangle \mapsto |2\rangle$.

An erasure channel according to such mapping is then defined as:

$\mathcal{A}_3^{\circ\varepsilon}(\rho) = (1-\gamma)\varepsilon(\rho) + \gamma|1\rangle\langle 1|$.

In such an embodiment, the two-outcome positive operator valued measurement is defined as the following, wherein a measurement outcome of 0 corresponds to $M_0$ and a measurement outcome of 1 corresponds to $M_1$, which is defined as $M_0$ subtracted from identity matrix I:

$M_0 = |0\rangle\langle 0| + |2\rangle\langle 2|$, $M_1 = I - M_0$.

Furthermore, in some embodiments, a two-outcome positive operator valued measurement may be performed onto a qubit that has been encoded into two three-level systems, which may be referred to as double-qutrit code. The mapping therefore comprises:

$\varepsilon_L: |0\rangle \mapsto |++\rangle, |1\rangle \mapsto |--\rangle,$, wherein $\pm\rangle = |0\rangle \pm |2\rangle$..

An erasure channel according to such mapping is then defined as:

$\mathcal{A}_3^{\otimes 2\circ\varepsilon}(\rho) = (1-\gamma)^2\varepsilon(\rho) + \gamma(1-\gamma)|1\rangle\langle 1| \otimes \tilde{\rho} + \gamma(1-\gamma)$
$\tilde{\rho} \otimes |1\rangle\langle 1| + o(\gamma)^2$.

In such an embodiment, the two-outcome positive operator valued measurement is defined as the following, wherein a measurement outcome of 0 corresponds to $M_0$ and a measurement outcome of 1 corresponds to $M_1$, which is defined as $M_0$ subtracted from identity matrix I:

$M_0 = |0\rangle\langle 0| + |2\rangle\langle 2|$, $M_1 = I - M_0$.

Furthermore, in some embodiments, a two-outcome positive operator valued measurement may be performed onto a qubit that has been encoded into two two-level systems, which may be referred to as quantum dual-rail code. The mapping comprises:

$\varepsilon: |0\rangle \mapsto |01\rangle, |1\rangle \mapsto |10\rangle$..

An erasure channel according to such mapping is then defined as:

$\mathcal{A}_2^{\otimes 2\circ\varepsilon}(\rho) = (1-\gamma)\varepsilon(\varphi + \gamma|00\rangle\langle 00|)$.

In such an embodiment, the two-outcome positive operator valued measurement is defined as the following, wherein a measurement outcome of 0 corresponds to $M_0$ and a measurement outcome of 1 corresponds to $M_1$, which is defined as $M_0$ subtracted from identity matrix I:

$M_0 = |01\rangle\langle 01| + |10\rangle\langle 10|$, $M_1 = I - M_0$.

Figure 7A:
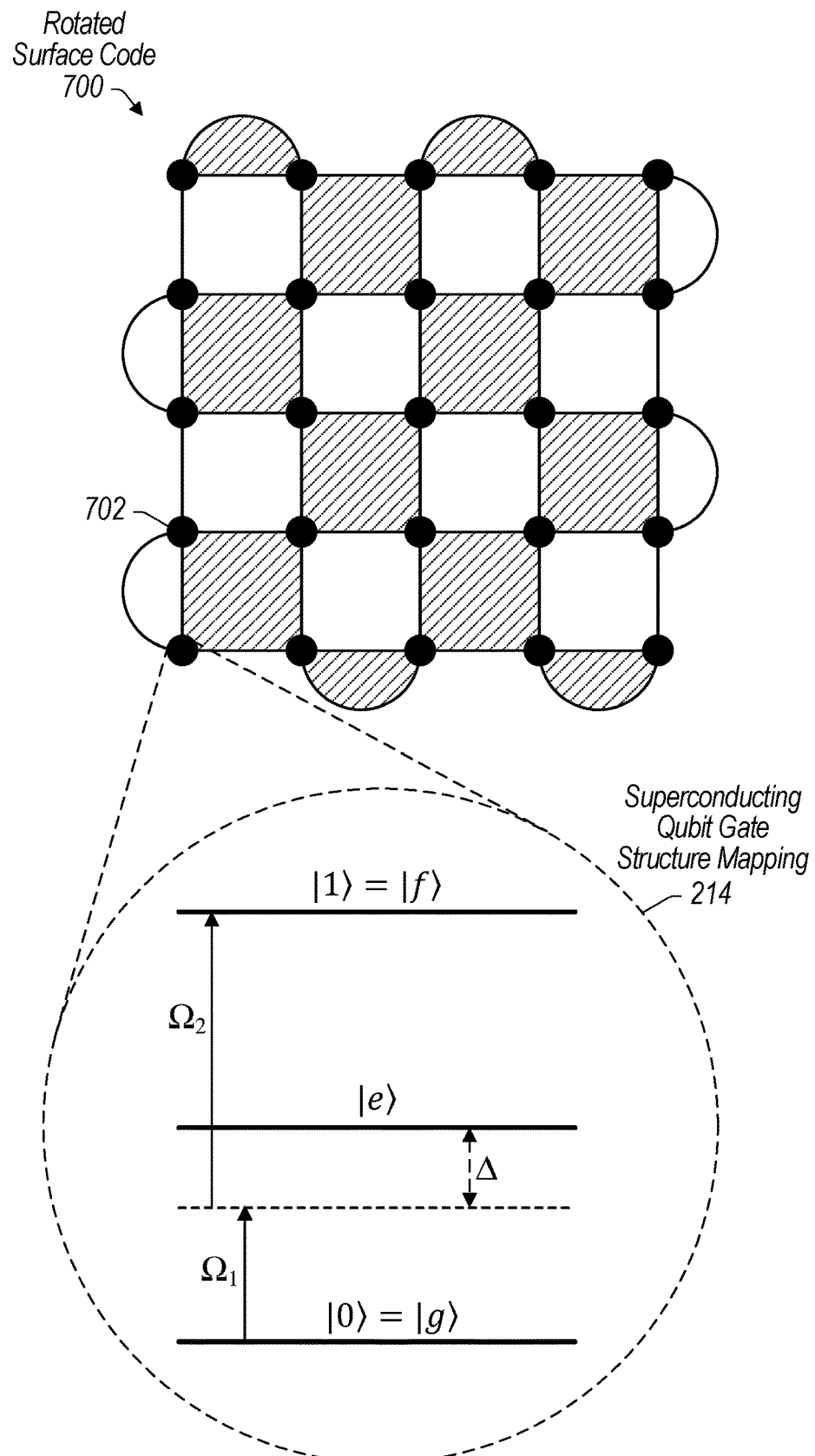
FIG. 7A illustrates a quantum low-density parity-check code comprising qubits configured using a mapping of a single superconducting qubit structure, such as for a qubit structure mapping shown in FIG. 2B, according to some embodiments.

FIG. 7A illustrates a quantum low-density parity-check code comprising qubits configured using a mapping of a single superconducting qubit structure, such as for a qubit structure mapping shown in FIG. 2B, according to some embodiments.

In some embodiments, a quantum low-density parity-check code is chosen such that it may receive heralding signals from a lower-level quantum code that indicate that an amplitude damping decay event has occurred. It may also receive information about other errors that have occurred at the lower-level quantum code such as, but not limited to, independent and identically-distributed single-qubit Pauli noise X, Y, and Z.

In some embodiments, a quantum low-density parity-check code that is chosen may include a 2D toric code on a square lattice with open boundary conditions, such as rotated surface code 700 comprised of qubits 702. However, other embodiments of topological quantum code or surface code may also be used, such as the 9-qubit Shor's code, the surface code with a twist, the XZZX surface code, or Pauli code, amongst others. Furthermore, in some embodiments such as the one shown in FIG. 7A, qubits 702 are configured using single superconducting qubit structure mapping 214, such as for a qubit structure mapping shown in FIG. 2B.

Figure 7B:
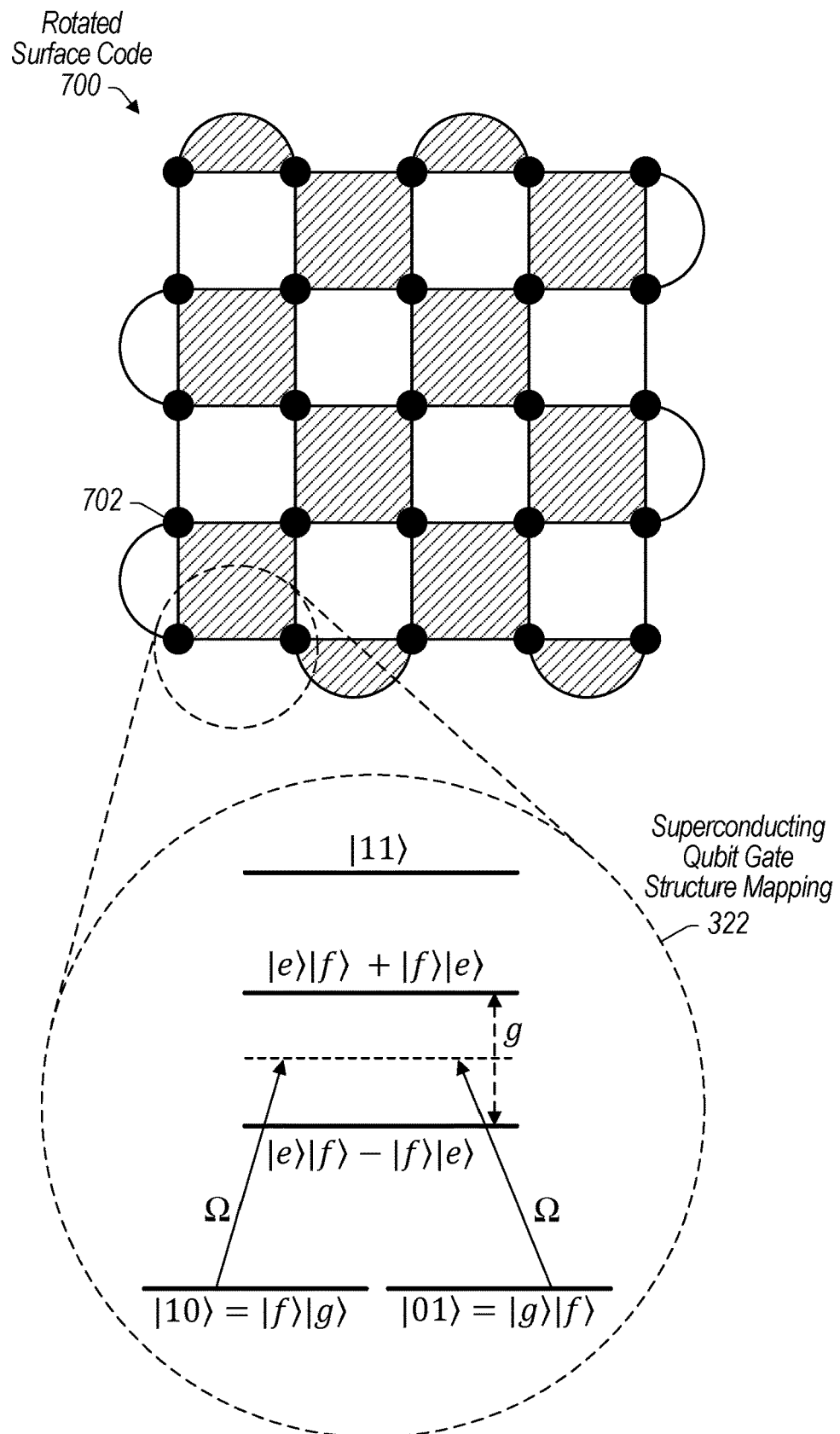
FIG. 7B illustrates a quantum low-density parity-check code comprising qubits configured using a mapping of a superconducting qubit gate structure; such as for a qubit structure mapping shown in FIG. 3B, according to some embodiments.

FIG. 7B illustrates a quantum low-density parity-check code comprising qubits configured using a mapping of a superconducting qubit gate structure, such as for a qubit structure mapping shown in FIG. 3B, according to some embodiments.

In some embodiments, rotated surface code 700 comprised of qubits 702 is configured using superconducting qubit gate structure mapping 322, such as for a qubit structure mapping shown in FIG. 3B.

Figure 7C:
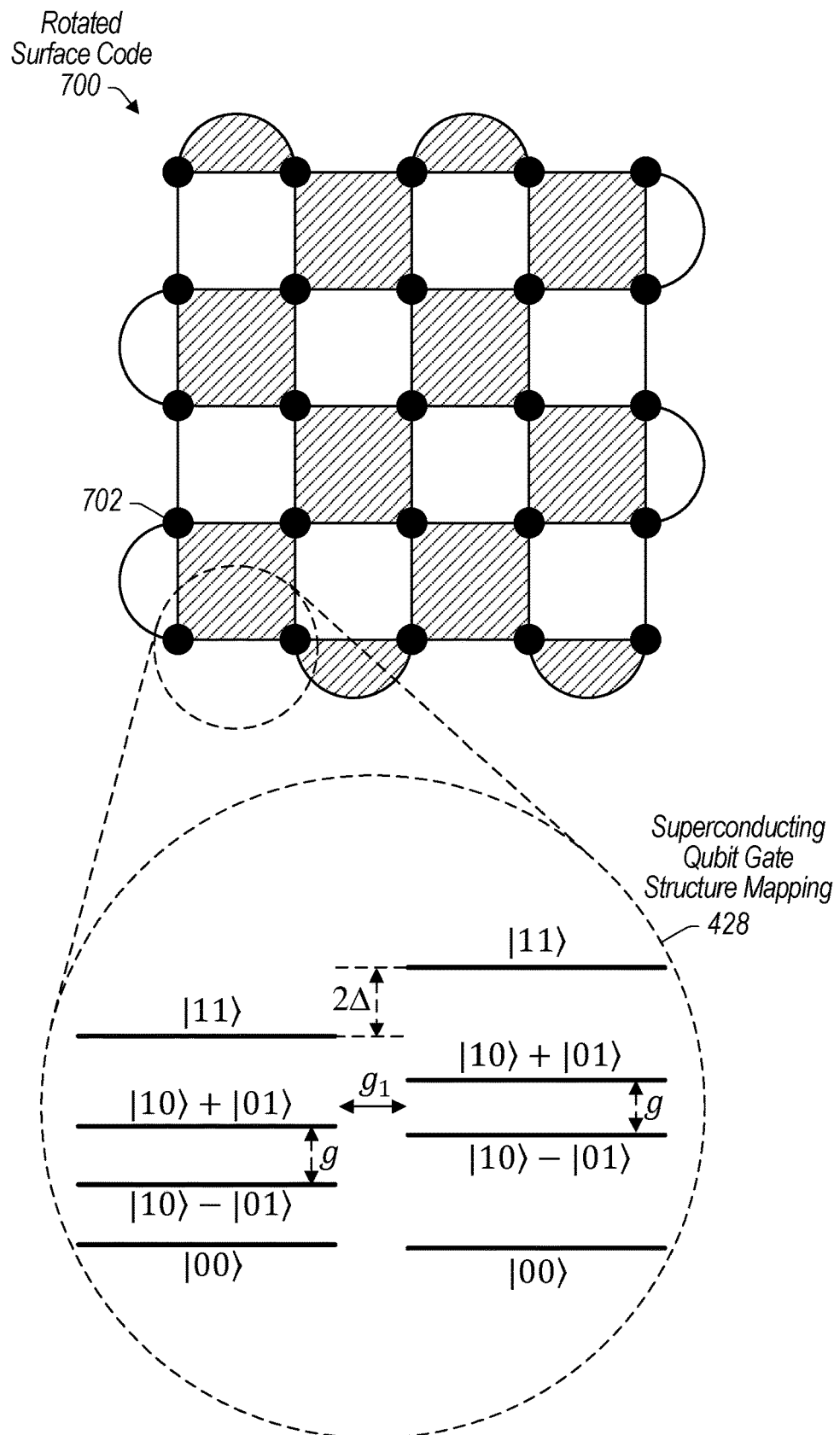
FIG. 7C illustrates a quantum low-density parity-check code comprising qubits configured using a mapping of a superconducting qubit gate structure; such as for a qubit structure mapping shown in FIG. 4B, according to some embodiments.

FIG. 7C illustrates a quantum low-density parity-check code comprising qubits configured using a mapping of a superconducting qubit gate structure; such as for a qubit structure mapping shown in FIG. 4B, according to some embodiments.

In some embodiments, rotated surface code 700 comprised of qubits 702 is configured using superconducting qubit gate structure mapping 428, such as for a qubit structure mapping shown in FIG. 4B.

Figure 7D:
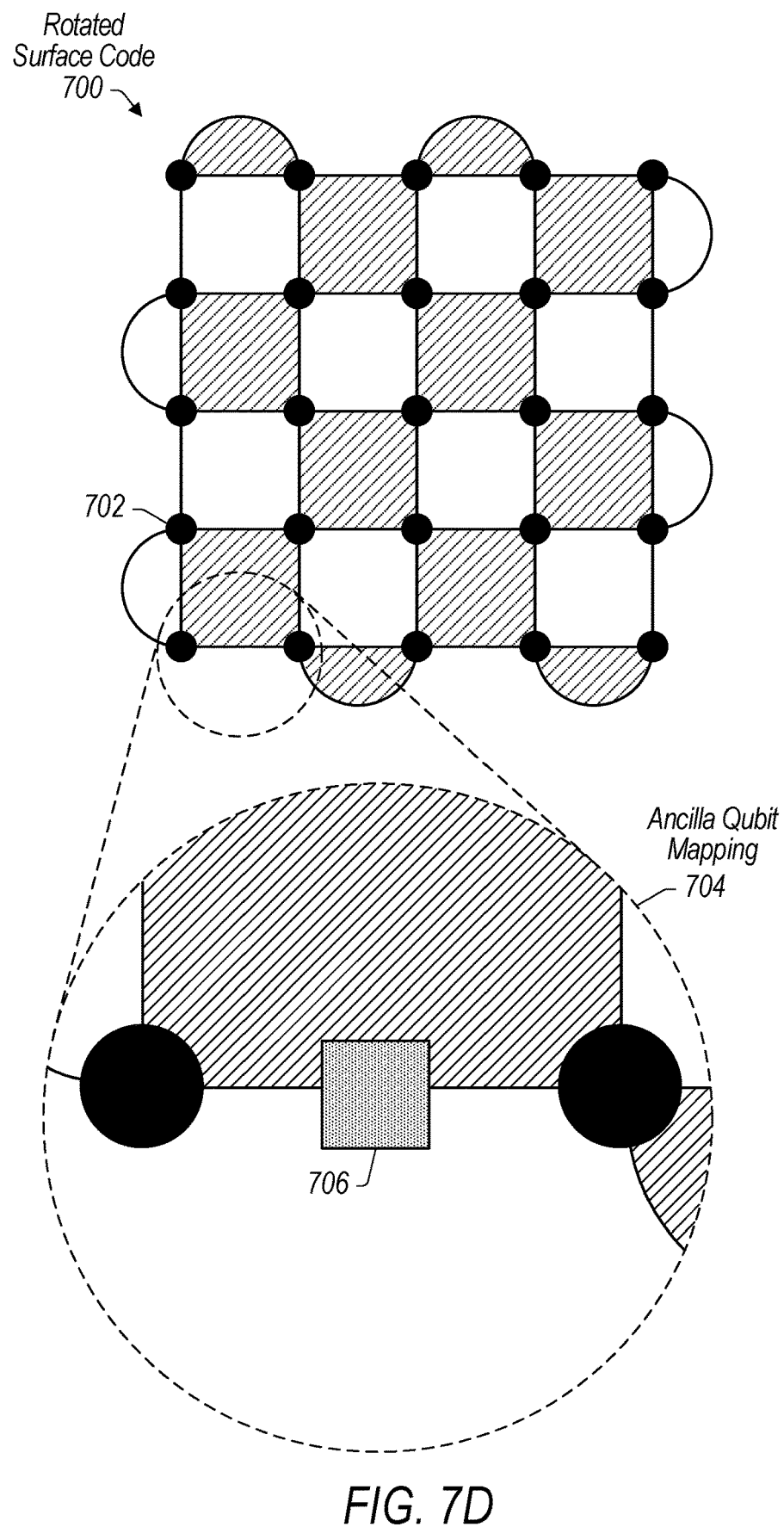
FIG. 7D illustrates a quantum low-density parity-check code comprising qubits configured using a mapping of an ancilla qubit to a data qubit, according to some embodiments.

FIG. 7D illustrates a quantum low-density parity-check code comprising qubits configured using a mapping of an ancilla qubit to a data qubit, according to some embodiments.

In some embodiments, rotated surface code 700 comprised of qubits 702 is configured using ancilla qubit mapping 704, wherein the one or more levels outside of the code space that can be used to herald that an amplitude damping decay event has occurred are mapped to ancilla qubit 706, which is repeated according to the configuration of quantum low-density parity-check code that is chosen.

Figure 8:
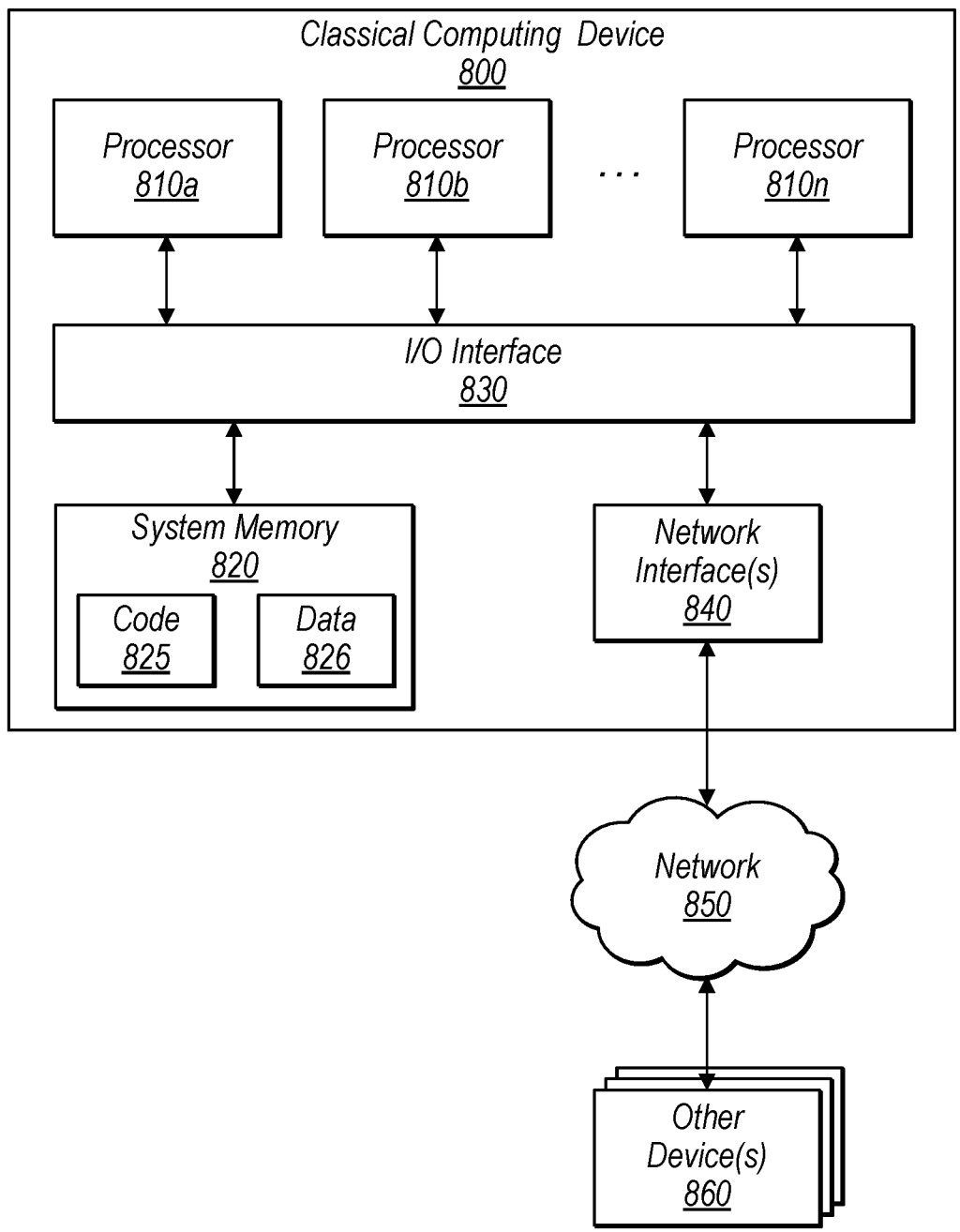
FIG. 8 is a block diagram illustrating an example classical computing device that may be used in at least some embodiments.

FIG. 8 is a block diagram illustrating an example classical computing device that may be used in at least some embodiments.

Illustrative Computer System

FIG. 8 illustrates such a general-purpose classical computing device 800 as may be used in any of the embodiments described herein. In the illustrated embodiment, classical computing device 800 includes one or more processors 810 coupled to a system memory 820 (which may comprise both non-volatile and volatile memory modules) via an input/ output (I/O) interface 830. Classical computing device 800 further includes a network interface 840 coupled to I/O interface 830.

In various embodiments, classical computing device 800 may be a uniprocessor system including one processor 810, or a multiprocessor system including several processors 810 (e.g., two, four, eight, or another suitable number). Processors 810 may be any suitable processors capable of executing instructions. For example, in various embodiments, processors 810 may be general-purpose or embedded processors implementing any of a variety of instruction set architectures (ISAs), such as the x86, PowerPC, SPARC, or MIPS ISAs, or any other suitable ISA. In multiprocessor systems, each of processors 810 may commonly, but not necessarily, implement the same ISA. In some implementations, graphics processing units (GPUs) may be used instead of, or in addition to, conventional processors.

System memory 820 may be configured to store instructions and data accessible by processor(s) 810. In at least some embodiments, the system memory 820 may comprise both volatile and non-volatile portions; in other embodiments, only volatile memory may be used. In various embodiments, the volatile portion of system memory 820 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 820 as code 825 and data 826.

In some embodiments, I/O interface 830 may be configured to coordinate I/O traffic between processor 810, system memory 820, and any peripheral devices in the device, including network interface 840 or other peripheral interfaces such as various types of persistent and/or volatile storage devices. In some embodiments, I/O interface 830 may perform any necessary protocol, timing or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between classical computing device 800 and other devices 860 attached to a network or networks 850, such as other computer systems or devices as illustrated in FIG. 1 through FIG. 7D, for example. In various embodiments, network interface 840 may support communication via any suitable wired or wireless general data networks, such as types of Ethernet network, for example. Additionally, network interface 840 may support communication via telecommunications/telephony networks such as analog voice networks or digital fiber communications networks, via storage area networks such as Fibre Channel SANs, or via any other suitable type of network and/or protocol.

In some embodiments, system memory 820 may represent one embodiment of a computer-accessible medium configured to store at least a subset of program instructions and data used for implementing the methods and apparatus discussed in the context of FIG. 1 through FIG. 7D. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to classical computing device 800 via I/O interface 830. A non-transitory computer-accessible storage medium may also include any volatile or non-volatile media such as RAM (e.g., SDRAM, DDR SDRAM, RDRAM, SRAM, etc.), ROM, etc., that may be included in some embodiments of classical computing device 800 as system memory 820 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 840. Portions or all of multiple computing devices such as that illustrated in FIG. 8 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "classical computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g., SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system comprising:
a quantum computing device configured to:
implement a quantum low-density parity-check code; and
herald that one or more amplitude damping decay events have occurred with respect to a qubit of the quantum low-density parity-check code; and
a classical computing device configured to:
receive a heralding signal indicating that an amplitude damping decay event has occurred; and
decode syndrome measurements taking into account the heralding signal.

2. The system of claim 1, wherein the quantum computing device is further configured to:
bias stochastic noise of the quantum computing device by applying dynamical decoupling pulse sequences.

3. The system of claim 1, wherein to decode the syndrome measurements, the classical computing device is further configured to:
adjust the decoding of syndrome measurements for a quantum low-density parity-check code based on the heralding signal.

4. The system of claim 1, wherein the classical computing device is further configured to:
adjust a fidelity threshold used in the decoding of the syndrome measurements in response to the reception of the heralding signal.

5. The system of claim 1, wherein the quantum low-density parity-check code comprises:
one or more transmons used to detect the one or more amplitude damping decay events.

6. A method of performing quantum computation that reduces errors caused by noise, the method comprising:
encoding a qubit into a code space, wherein the encoding uses multiple levels comprising a first level which is mapped to a first level of the code space and a second level which is mapped to a second level of the code space, wherein there is at least one intermediate level between the first and second levels which is outside of the code space; and
providing a heralding signal indicating an event of amplitude damping decay, wherein the amplitude damping decay is detected via one or more measurements indicating a leakage outside of the code space.

7. The method of claim 6, wherein:
the multiple levels are implemented using a transmon,
the first level of the code space corresponds to a ground state of the transmon;
the second level of the code space corresponds to a second excited state of the transmon; and
the intermediate level outside of the code space indicating amplitude damping decay corresponds to a first excited state of the transmon.

8. The method of claim 6, wherein:
the multiple levels are implemented using a plurality of transmons, the first level is chosen from amongst the available energy states of the plurality of transmons;
the second level is chosen from amongst the remaining energy states of the plurality of transmons; and
the intermediate levels comprising the remaining energy states apart from the first and second levels chosen for the code space are used to indicate amplitude damping decay.

9. The method of claim 6, further comprising:
engineering dynamical decoupling pulse sequences that bias stochastic noise of a quantum computing device performing the quantum computation to a noise channel corresponding to amplitude damping noise; and
applying the dynamical decoupling pulse sequences to the quantum computing device to bias noise towards the amplitude damping noise channel and away from other stochastic noise channels.

10. The method of claim 6, further comprising:
using the heralding signal as input to a quantum low-density parity-check code to indicate to the quantum low-density parity-check code an occurrence of amplitude damping decay.

11. The method of claim 10, wherein the heralding signal is indicated as an additional one or more qubits in the quantum low-density parity-check code, wherein the one or more additional qubits encode the presence, or lack of presence, of amplitude damping decay.

12. The method of claim 10, further comprising:
erasing a qubit from being considered in decoding syndrome measurements of the quantum low-density parity-check code based on the heralding signal indicating an amplitude damping decay event associated with the qubit being erased.

13. The method of claim 12, further comprising:
diagnosing said erasing a qubit by performing a two-outcome positive operator valued measurement wherein a first outcome confirms the erasure event and a second outcome confirms the erasure event has not occurred.

14. The method of claim 6, further comprising:
performing syndrome measurements for a quantum low-density parity-check code used in the quantum computation, wherein the syndrome measurements comprise information about the mapping of the code space.

15. The method of claim 14, wherein the multiple levels are implemented using a ground state and a second excited state of a transmon, and wherein said performing the syndrome measurements comprises:
performing one or more projective measurements onto the code space to detect leakage, or lack thereof, outside of the code space.

16. The method of claim 14, wherein the multiple levels are implemented using energy states of more than one transmon, and wherein said performing the syndrome measurements comprises:
performing one or more projective measurements onto the code space to detect leakage, or lack thereof, outside of the code space.

17. One or more non-transitory, computer-readable, storage media storing program instructions, that when executed using a quantum computing device, cause the quantum computing device to:
perform quantum computation that reduces errors caused by noise, wherein a qubit is encoded into a code space used in the quantum computation, wherein the code space is encoded using multiple levels comprising a first level which is mapped to a first level of the code space and a second level which is mapped to a second level of the code space, wherein there is at least one intermediate level between the first and second levels that is outside of the code space; and provide a heralding signal indicating an event of amplitude damping decay, wherein the amplitude damping decay signal corresponds to leakage detected outside of the code space.

18. One or more non-transitory, computer-readable, storage media of claim 17, wherein the program instructions, when executed on or across one or more processors, cause the one or more processors to:
    decode syndrome measurements based on the heralding signal indicating the event of amplitude damping decay; and
    apply the heralding signal as input to a quantum low-density parity-check code to indicate to the quantum low-density parity-check code an occurrence of amplitude damping decay.

19. One or more non-transitory, computer-readable, storage media of claim 17, wherein the program instructions, when executed on or across one or more processors, cause the one or more processors to:
    decode syndrome measurements based on the heralding signal indicating the event of amplitude damping decay; and
    adjust a fidelity threshold used in the decoding syndrome measurements in response to the reception of the heralding signal indicating that the one or more amplitude damping decay events have occurred.

20. One or more non-transitory, computer-readable, storage media of claim 19, wherein to decode the syndrome measurements, the program instructions, when executed on or across one or more processors, further cause the one or more processors to:
    erase a qubit from being considered in the decoding of the syndrome measurements in a quantum low-density parity-check code based on the heralding signal indicating an amplitude damping decay event associated with the qubit being erased.

* * * * *